(12) United States Patent
Akerling et al.

(10) Patent No.: US 6,936,913 B2
(45) Date of Patent: Aug. 30, 2005

(54) HIGH PERFORMANCE VIAS FOR VERTICAL IC PACKAGING

(75) Inventors: Gershon Akerling, Culver City, CA (US); James M. Anderson, Huntington Beach, CA (US); Eric L. Upton, Bellevue, WA (US)

(73) Assignee: Northrop Grumman Corporation, Los Angeles, CA (US)

( * ) Notice: Subject to any disclaimer, the term of this patent is extended or adjusted under 35 U.S.C. 154(b) by 85 days.

(21) Appl. No.: 10/317,680

(22) Filed: Dec. 11, 2002

(65) Prior Publication Data

US 2004/0113264 A1 Jun. 17, 2004

(51) Int. Cl.$^7$ .............................................. H01L 23/02
(52) U.S. Cl. ...................... 257/686; 257/687; 257/688; 257/689; 438/109
(58) Field of Search ................................ 257/686–689, 257/734–735; 438/109

(56) References Cited

U.S. PATENT DOCUMENTS

| | | | |
|---|---|---|---|
| 3,761,782 A | 9/1973 | Youmans | |
| 4,807,021 A | 2/1989 | Okumura | |
| 5,229,647 A | 7/1993 | Gnadinger | |
| 6,219,254 B1 | 4/2001 | Akerling et al. | |
| 6,667,551 B2 * | 12/2003 | Hanaoka et al. | 257/750 |
| 6,674,161 B1 * | 1/2004 | Haba | 257/686 |
| 2002/0017710 A1 | 2/2002 | Kurashima et al. | |

FOREIGN PATENT DOCUMENTS

WO    WO 96/13062    5/1996

OTHER PUBLICATIONS

S. Linder, et al.; Fabrication Technology for Wafer Through-Hole Interconnections and Three–Dimensional Stacks of Chips and Wafers ; Jan. 25, 1994; pp. 349–354.

European Search Report mailed Nov. 28, 2003 in European application No. 03017796.8-2203.

RDA, "RD Automation CDB-50 Flip Chip Die Bonder," website ad, p. 3, (Dec. 10, 2001).

Jordan Neysmith and Daniel F. Baldwin, "A Modular, Chip Scale, Direct Chip Attach MEMS Package: Architecture and Processing," The International Journal of Microcircuits and Electronic Packaging, vol. 23 (No. 4), p. 474–480, (Dec. 10, 2000).

* cited by examiner

*Primary Examiner*—Dung A. Le
(74) *Attorney, Agent, or Firm*—Noel F. Heal

(57) ABSTRACT

A semiconductor device, a microelectromechanical system package and a method of making the same utilize high performance vias for vertical IC packaging. A semiconductor die of the device/package has a substrate with integrated circuitry formed on a front side of the substrate. A metal bonding pad overlies the substrate on the front side of the substrate and is electrically connected to the integrated circuitry. A solder bump is located on the metal bonding pad. An electrically conductive via extends through the substrate from the metal bonding pad to a back side of the substrate where the via forms a side wall of a via hole. A plurality of the substrates are stacked on one another with the outer end of the solder bump of one substrate fitting within the via hole of an adjacent substrate. During reflow soldering, surface tension forces of the molten solder bump self-align the substrates.

16 Claims, 2 Drawing Sheets

HIGH PERFORMANCE VIAS FOR VERTICAL IC PACKAGING

BACKGROUND OF THE INVENTION

1. Field of the Invention

A semiconductor device and a microelectromechanical system package and a method of making the same involve vertically packaging and simultaneously electrically interconnecting a plurality of semiconductor chip scale substrates using high performance vias.

2. Discussion of the Related Art

Prior vertical packaging techniques require forming an integrated circuit (IC) stack with epoxy followed by mechanically lapping the sides of this formation in preparation for forming the interconnect between the IC's in the stack along these sides of the stack. Prior techniques require the formation and attachment of lead frames to each die in order to bring what would have been bonding pads out to the edges of the stack. Some prior techniques employ conductive epoxy for signal and power traces along the sides of the stack. This technique, which is particularly hand labor intensive is expensive.

Prior vertical packaging techniques have largely eluded or otherwise resisted assembly automation and any incorporation into the regular wafer fabrication context. Thus, products of these prior techniques have been very expensive, and quality/consistency challenged and, in the case of memory chips, frequently overtaken in capacity by the next generation chips. New personal electronic appliances require evermore memory in order to enable the greater array of functionality that consumers demand. Some examples of these are cell phones, cameras and personal digital assistants and new, future appliances that contain the convergence of these. And now, the packing density of memory chips will reach its limit known in the art where devices can be made so small that they no longer exhibit useful behavior.

SUMMARY OF THE INVENTION

A semiconductor device and a microelectromechanical system package of the invention comprise a semiconductor die having a substrate with integrated circuitry formed on a front side of the substrate. A metal bonding pad overlies the substrate on the front side thereof and is electrically connected to the integrated circuitry. A solder bump is located on the metal bonding pad. An electrically conductive via is electrically connected with the metal bonding pad and extends through the substrate from the metal bonding pad to a back side of the substrate. The solder bump and the via hole are aligned with one another along an axis normal to a plane of the substrate. In the example embodiment, the size of the opening of the via hole in the back side of the substrate is on the order of the diameter of a meniscus on the solder bump.

A plurality of the semiconductor dies or similarly constructed semiconductor chip scale substrates are stacked on one another with the metal bonding pad of one substrate of the stack located opposite the via hole in an adjacent substrate of the stack and with the solder bump on the metal bonding pad of the one substrate soldered to the via of the adjacent substrate. The outer end of the solder bump on the one substrate extends within the via hole in the adjacent substrate. Surface tension forces during reflow soldering are effective to finely align the substrates during soldering. According to the method of making the stack of a plurality of semiconductor chip scale substrates of the invention, the chip scale substrates are semiconductor wafers wherein after the stacking and reflow soldering, the soldered wafers are diced to form a plurality of stacks of semiconductor dies. The invention enables a vertical interconnection/packaging which can be completely automated using existing wafer processing and automated assembly equipment and thus achieves state-of-the-art reproducibility, consistency, quality and low cost.

Figure 1:
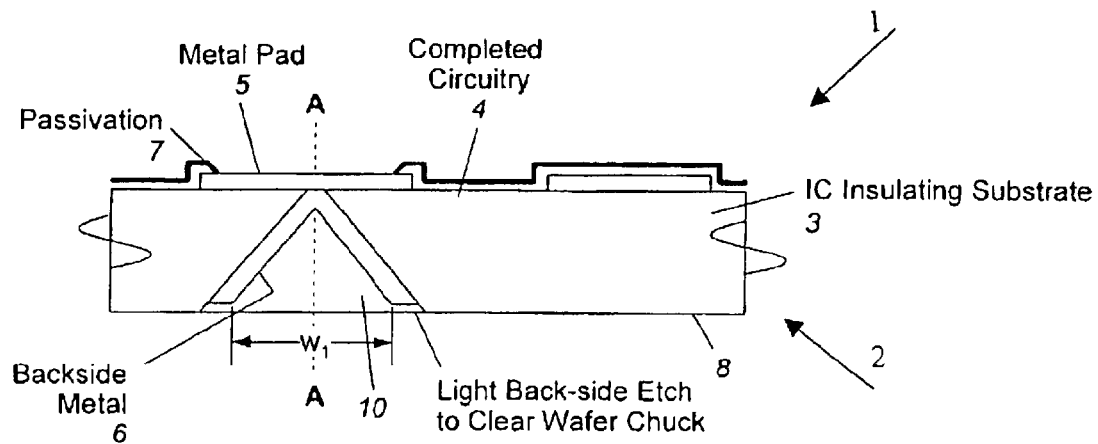
FIG. 1 is a schematic cross-sectional view, taken normal to a plane of a semiconductor wafer, and showing a portion of the wafer being prepared to form a semiconductor device according to an example embodiment of the invention.

The foregoing and a better understanding of the present invention will become apparent from the following detailed description of an example embodiment and the claims when read in connection with the accompanying drawings, all forming a part of the disclosure of this invention. While the foregoing and following written and illustrated disclosure focuses on disclosing an example embodiment of the invention, it should be clearly understood that the same is by way of illustration and example only and the invention is not limited thereto.

DETAILED DESCRIPTION OF PREFERRED EMBODIMENT

In the following detailed description, like reference numerals and characters may be used to designate identical, corresponding, or similar components in differing drawing figures. Furthermore, in the detailed description to follow, example sizes/models/values/ranges may be given, although the present invention is not limited thereto. Well-known power connections and other well-known elements have not been shown within the drawing figures for simplicity of illustration and discussion and so as not to obscure the invention.

Referring now to the drawings, a semiconductor device 1 according to the present invention comprises a semiconductor die 2 having an insulating substrate 3 with integrated circuitry 4 formed on a front side of the substrate. A metal bonding pad 5 overlies the substrate on the front side thereof and is electrically connected to the integrated circuitry. A passivation 7 is provided over the front side of the substrate about the metal bonding pad. An electrically conductive via 10 is electrically connected with the metal bonding pad and extends through the substrate from the metal bonding pad to a back side 8 of the substrate where the via form includes a side wall 6 of a via hole 10.

In the example embodiment, the size of the opening $w_1$ of the via hole in the back side of the substrate is on the order of the diameter $d_1$ of a meniscus 11 of a solder bump 12 on the metal bonding pad. The solder bump and the via hole are aligned with one another along an axis A—A normal to a plane of the substrate B—B. The diameter $d_1$ is 100 µm in the example embodiment but could be smaller or larger than this.

The via 10 extends from the metal bonding pad through the substrate is in the shape of an inverted pyramid with the side wall at an angle α of 54.7° to the (100)—plane of the substrate B—B. This angle is characteristic for anisotropic etching the substrate material as is known in the state of the art and as discussed below but is not limited to this angle. More steeply inclined side walls would give aspect ratios of about 5 in this context and enable 10 µm to 20 µm sized solder bumps. The semiconductor die can be a dynamic random access memory integrated (DRAM) circuit chip, for example.

Figure 2:
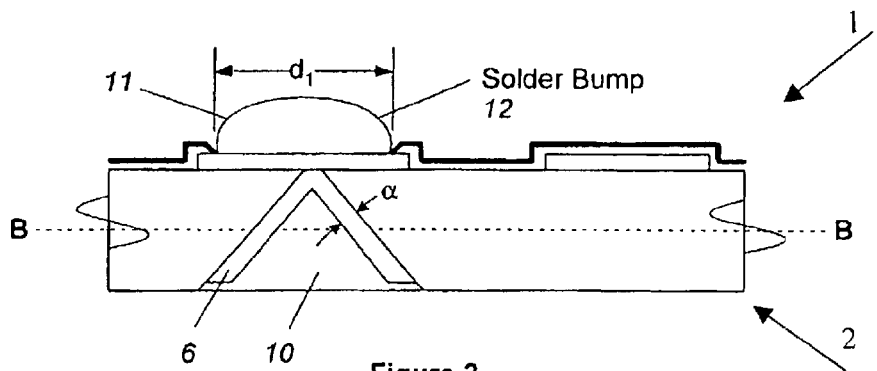
FIG. 2 is a schematic cross-sectional view of the semiconductor wafer of FIG. 1 to which a solder bump has been added.

In the example embodiment, the insulating substrate 3 is made of $SiO_2$, but this is not limiting as other materials such as sapphire could be used. The opening for the via 10 is cut in the back side of the insulating substrate using anisotropic etching which characteristically cuts the side walls of the opening at the angle α of 54.7° with respect to the plane of the substrate B—B, which would be the (100)—plane in silicon, or as is characteristic for the substrate materials. Subsequently dielectric and metallization are applied around/through the hole to form the conductive side wall of the hole as via 10. The conductive via 10 is closed at its end electrically connected with the metal bonding pad 5 and extends through the substrate along the side wall 6 of the opening to a location at or near the back side of the substrate. After formation of the via, the solder bump 12 is applied to the metal bonding pad on the front side of the substrate by a ball bonder machine or by way of chemical vapor deposition or electro plating at wafer level or by other means known in the art. These steps can be performed at a plurality of locations of a single wafer during regular wafer processing, and the wafer then subjected to normal saw and dicing to produce a plurality of semiconductor dies as illustrated in FIG. 2. Alternatively, the semiconductor wafers can be stacked and joined as described below with reference to FIGS. 3 and 4, before dicing. The solder bump 12 is a PbSn alloy but other metal alloys could be used. The term "solder bump" is used to denote metal alloys which can be reflowing upon heating to join the substrates to one another or to a carrier or other substrate in a microelectromechanical system package, for example.

The semiconductor device of the illustrated embodiment comprises a plurality of the semiconductor dies which are stacked on one another with the metal bonding pad of one die of the stack located opposite the via hole in an adjacent die of the stack. The stacked substrates are reflow soldered to join the solder bump of the one substrate to the via of the other adjacent substrate. During reflow soldering, the surface tension forces of the solder bump interact with the side wall 6 of the via hole to align the adjacent substrates with one another.

Figure 3:
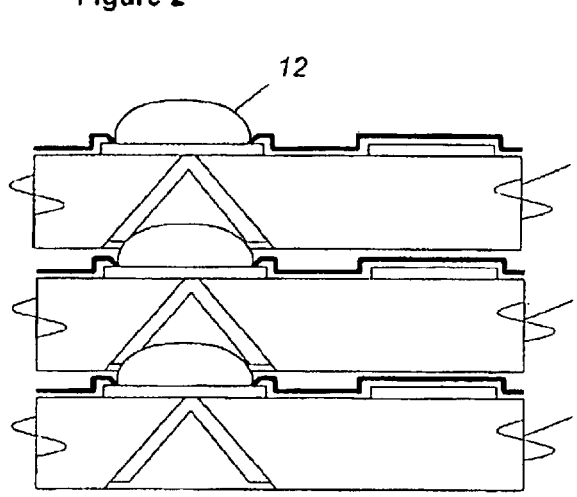
FIG. 3 is a schematic, cross-sectional view of several semiconductor wafers prepared as shown in FIGS. 1 and 2, and stacked on one another in preparation for joining by soldering to form a semiconductor device according to the invention.
Figure 4:
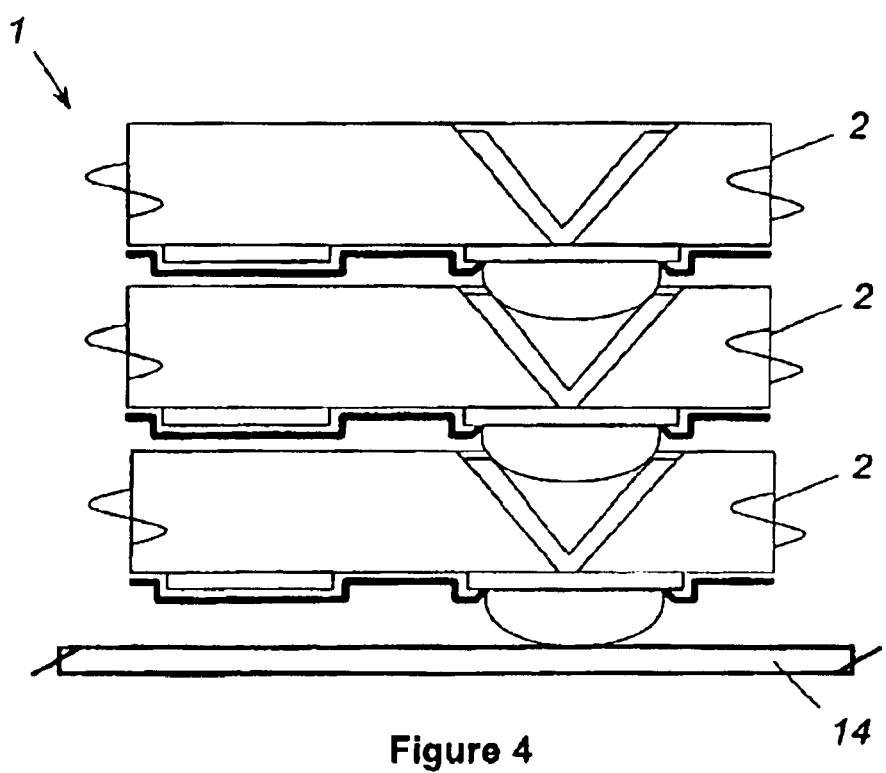
FIG. 4 is a schematic, cross-sectional view of the stack of semiconductor wafers of FIG. 3 which has been inverted and flip-chip mounted on a carrier by reflow soldering to join the semiconductor wafers to one another and to the carrier as part of a micro-electromechanical system package according to the invention which includes the semiconductor device of the example embodiment.

The semiconductor device in FIG. 4 can be part of a microelectromechanical system package, wherein the stack in FIG. 3 has been inverted and flip-chip joined to a carrier 14 of the package during reflow soldering. Additional components of the package, not shown, could be stacked with the substrates 3 or otherwise located on the carrier 14 for integration into the package.

One sequence of steps of the method of making a stack of a plurality of semiconductor chip scale substrates of the present invention comprises first completing the integrated circuit 4 with metal bonding pad 5 on the front side of the wafer 3. A passivation 7 is then applied on the front side about the pad 5 whereupon the wafer is temporarily bonded at the front side to a backing wafer and the back side of the substrate 3 is then lapped to 100 µm. Pattern anisotropic etching is then performed from the back side to cut the holes 10 in the back side of the wafer. Alignment of the back side pattern is known in the state of the art. A dielectric and the back side metal of the via 10 are then applied and the back side of the wafer is lapped to clear the field. A portion of the applied dielectric is removed at the center of the via 10 before metal is applied so as to allow the applied metal in the via 10 to make electrical contact with the back side of the metal bonding pad 5. Use of insulating substrate obviates the use of deposited dielectric in the via. The backing wafer is then detached and the solder bumps 12 are applied to the metal bonding pads 5 on the front side of the substrates as described above. The wafer is then probe tested using so called "membrane" probes in order to not damage the bumps on an insulating chuck, diced and sorted. The semiconductor dies 2 are then stacked as shown in FIG. 3 and the assembly flip-chip mounted to the carrier and one another in a single soldering operation to form the package depicted in FIG. 4.

By creating the electrical vias 10 through the wafer and forming the solder/alloy bumps thereupon all within the context of regular wafer processing in state-of-the-art automated die assembly machines, a means of vertically packing and simultaneously electrically interconnecting a plurality of dies such as DRAM chips is afforded more economically than in vertical packaging schemes known in the art. Furthermore, while die thinning is employed in order to achieve the minimum bump and via size for enhanced electrical signal propagation performance, the vertical stack height is kept close to the physical minimum. Thus, for example, a vertical stack of nine DRAM integrated circuits would be less than 1.25 mm. In addition, since the signal interconnect X-Y dimensionality can be on the scale of 100 µm or so with the present invention, and is not routed around the edge of the die, electrical performance is maximized. The inter-die contact by way of the alloy bumps and vias is also more beneficial from the standpoint of heat transfer as compared to prior techniques, which employ adhesives, including epoxy between dies.

Although the present invention has been described with reference to one example embodiment thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A semiconductor device comprising:
   first and second semicondutor dies, each having a substrate with integrated circuitry formed on a front side of the substrate;
   a metal bonding pad overlying each of the substrates on the front side thereof and electrically connected to the integrated circuitry;
   at least one solder bump on the metal bonding pad of at least one of the semiconductor dies; and at least one electrically conductive via electrically connected with the metal bonding pad of at least one of the semiconductor dies and extending through the substrate from the metal bonding pad to a back side of the subtrate where the electrically conductive via forms a side wall of a via hole;

wherein the size of the opening of the via hole in the back side of the substrate is approximately equal to the diameter of a meniscus on the solder bump;

wherein the meniscus projects into the opening of the via hole when the first and second semiconductor dies are stacked with the via hole and solder bump in approximate lateral registration;

and wherein the via hole and solder bump facilitate lateral self-alignment and assembly of the first and second semiconductor dies when the solder bump is reflowed into the via hole.

2. The semiconductor device according to claim 1, wherein the solder bump and the via hole are aligned with one another along an axis normal to a plane of the substrate.

3. The semiconductor device according to claim 1, wherein the first and second semiconductor dies together form a dynamic random access memory integrated circuit chip.

4. The semiconductor device according to claim 1, wherein the front side of each of the semiconductor dies is passivated about the metal bonding pad and solder bump.

5. The semiconductor device according to claim 1, wherein the via extending from the metal bonding pad through the substrate is in the shape of an inverted pyramid.

6. The semiconductor device according to claim 1, wherein the side wall of the via hole extends at an angle to a plane of the substrate that is characteristic of an anisotropic etching of said substrate.

7. The semiconductor device according to claim 1, and further comprising additional similar semiconductor dies, wherein the first, second and additional semiconductor dies are stacked on one another with the metal bonding pad of one die of the stack located opposite the via hole in an adjacent die of the stack and with the solder bump on the metal bonding pad of the one die soldered to the via of the adjacent die.

8. The semiconductor device according to claim 7, wherein a bottom semiconductor die of the stacked semiconductor dies is flip-chip mounted to a carrier by way of the metal bonding pad and solder bump thereon of the bottom semiconductor die of the stacked semiconductor dies.

9. A microelectromechanical system package comprising:

a plurality of semiconductor chip scale substrates stacked on one another;

wherein each of the stacked substrates includes a semiconductor die having a substrate with integrated circuitry formed on a front side of the substrate;

a metal bonding pad overlying the substrate on the front side thereof and electrically connected to the integrated circuitry;

a solder bump on the metal bonding pad; and an electrically conductive via electrically connected with the metal bonding pad and extending through the substrate from the metal bonding pad to a back side of the substrate where the electrically conductive via forms a side wall of via hole;

wherein the size of the opening of the via hole in the back side of the substrate is approximately equal to the diameter of a meniscus on the solder bump;

wherein the meniscus projects into the opening of the via hole when the semiconductor dies are stacked with corresponding via holes and solder bumps in approximate lateral registration;

and wherein the via holes and solder bumps facilitate lateral self-alignment and assembly of the semiconductor dies when the solder bumps reflowed into the corresponding via holes.

10. The microelectromechanical system package according to claim 9, wherein corresponding solder bumps and the via holes are aligned with one another along an axis normal to a plane of each substrate.

11. The microelectromechanical system package according to claim 9, wherein the front side of each semiconductor die is passivated about the metal bonding pad and solder bump.

12. The microelectromechanical system package according to claim 9, wherein the via extending from the metal bonding pad through the substrate is in the shape of an inverted pyramid.

13. The microelectromechanical system package according to claim 9, wherein the side wall of each via hole extends at an angle to a plane of the substrate that is characteristic of an anisotropic etching of said substrate.

14. The microelectromechanical system package according to claim 9, wherein the stacked substrates include a plurality of the semiconductor dies stacked on one another with the metal bonding pad of one die of the stack located opposite the via hole in an adjacent die the stack and with the solder bump on the metal bonding pad of the one die reflow soldered to the via of the adjacent die.

15. The microelectromechanical system package according to claim 14, wherein the size of the opening of the via hole in the back side of the substrate of the adjacent die is approximately equal to the diameter of a meniscus on the solder bump on the metal bonding pad of the one die with the outer end of the solder bump on the one die extending within the via hole in the adjacent die.

16. The microelectromechanical system package according to claim 14, wherein the bottom semiconductor die of the stacked semiconductor dies is flip-chip mounted to a carrier by way of metal bonding pad and solder bump thereon of the bottom semiconductor die of the stacked semiconductor dies.

* * * * *